United States Patent
Kern et al.

(10) Patent No.: US 10,319,460 B2
(45) Date of Patent: Jun. 11, 2019

(54) SYSTEMS AND METHODS UTILIZING A FLEXIBLE READ REFERENCE FOR A DYNAMIC READ WINDOW

(71) Applicant: Infineon Technologies AG, Neubiberg (DE)

(72) Inventors: Thomas Kern, Munich (DE); Jens Rosenbusch, Munich (DE); Ulrich Backhausen, Taufkirchen (DE); Thomas Nirschl, Putzbrunn (DE)

(73) Assignee: Infineon Technologies AG, Neubiberg (DE)

(*) Notice: Subject to any disclaimer, the term of this patent is extended or adjusted under 35 U.S.C. 154(b) by 448 days.

(21) Appl. No.: 13/966,679

(22) Filed: Aug. 14, 2013

(65) Prior Publication Data

US 2015/0052387 A1   Feb. 19, 2015

(51) Int. Cl.
| | |
|---|---|
| *G11C 29/50* | (2006.01) |
| *G11C 16/34* | (2006.01) |
| *G06F 11/16* | (2006.01) |
| *G11B 20/18* | (2006.01) |
| *G06F 11/10* | (2006.01) |
| *G11C 29/02* | (2006.01) |
| *G11C 29/42* | (2006.01) |
| *G11C 29/52* | (2006.01) |
| *G11C 16/28* | (2006.01) |

(52) U.S. Cl.
CPC .... *G11C 29/50004* (2013.01); *G06F 11/1048* (2013.01); *G06F 11/1666* (2013.01); *G11B 20/1883* (2013.01); *G11C 16/3495* (2013.01); *G11C 29/021* (2013.01); *G11C 29/028* (2013.01); *G11C 29/42* (2013.01); *G11C 29/52* (2013.01); *G11C 16/28* (2013.01)

(58) Field of Classification Search
CPC .............. G11C 16/349; G11C 16/3495; G11C 29/50004
USPC .................................................. 714/735, 736
See application file for complete search history.

(56) References Cited

U.S. PATENT DOCUMENTS

| | | | |
|---|---|---|---|
| 6,188,615 B1 | 2/2001 | Perner et al. | |
| 6,603,694 B1* | 8/2003 | Frankowsky | ......... G11C 11/406 365/222 |
| 7,009,901 B2 | 3/2006 | Baker | |
| 7,379,339 B2* | 5/2008 | Paparisto et al. | ........ 365/185.21 |
| 7,471,562 B2 | 12/2008 | Hung et al. | |
| 7,599,220 B2 | 10/2009 | Lin et al. | |
| 7,738,296 B2 | 6/2010 | Lin | |
| 7,808,842 B1 | 10/2010 | Raghavan et al. | |
| 7,817,469 B2* | 10/2010 | Avraham et al. | ........ 365/185.09 |
| 7,876,621 B2* | 1/2011 | Sharon et al. | ........... 365/185.24 |
| 7,929,365 B2 | 4/2011 | Chen et al. | |

(Continued)

FOREIGN PATENT DOCUMENTS

CN   101178943 A1   5/2008

*Primary Examiner* — Steve N Nguyen
(74) *Attorney, Agent, or Firm* — Eschweiler & Potashnik, LLC

(57) ABSTRACT

A memory system having a flexible read reference is disclosed. The system includes a memory partition, a failcount component, and a controller. The memory partition includes a plurality of memory cells. The failcount component is configured to generate failcounts in response to read operations of the memory partition. The controller is configured to calibrate a reference value for the memory partition by utilizing the failcounts.

17 Claims, 5 Drawing Sheets

(56) References Cited

U.S. PATENT DOCUMENTS

| | | | |
|---|---|---|---|
| 8,072,805 B2* | 12/2011 | Chou et al. | 365/185.03 |
| 8,111,547 B2 | 2/2012 | Lin et al. | |
| 8,156,398 B2* | 4/2012 | Sommer | 714/752 |
| 8,369,141 B2* | 2/2013 | Sommer et al. | 365/185.03 |
| 8,456,911 B2* | 6/2013 | Yuan et al. | 365/185.11 |
| 8,467,249 B2* | 6/2013 | Katz et al. | 365/185.18 |
| 8,938,659 B2* | 1/2015 | Wu et al. | 714/773 |
| 8,996,936 B2* | 3/2015 | Sevugapandian | 714/723 |
| 2004/0136236 A1* | 7/2004 | Cohen | 365/185.2 |
| 2005/0024978 A1* | 2/2005 | Ronen | 365/232 |
| 2008/0123419 A1* | 5/2008 | Brandman et al. | 365/185.09 |
| 2009/0164710 A1 | 6/2009 | Choi et al. | |
| 2009/0213653 A1* | 8/2009 | Perlmutter et al. | 365/185.03 |
| 2010/0142274 A1 | 6/2010 | Goda et al. | |
| 2010/0309726 A1 | 12/2010 | Yang | |
| 2011/0289388 A1* | 11/2011 | Nelson et al. | 714/773 |
| 2012/0254699 A1 | 10/2012 | Ruby et al. | |
| 2013/0148435 A1* | 6/2013 | Matsunaga | 365/185.23 |
| 2014/0063971 A1* | 3/2014 | Lee et al. | 365/185.22 |
| 2014/0143630 A1* | 5/2014 | Mu et al. | 714/763 |
| 2014/0208174 A1* | 7/2014 | Ellis et al. | 714/721 |
| 2014/0258590 A1* | 9/2014 | Kochar et al. | 711/103 |

* cited by examiner

SYSTEMS AND METHODS UTILIZING A FLEXIBLE READ REFERENCE FOR A DYNAMIC READ WINDOW

BACKGROUND

Non volatile memory generally stores data in a cell. The data is read by applying a voltage to sense or read the data stored in the cell. The "read" generates a cell voltage for the read cell. The cell voltage (e.g. threshold voltage) is compared with a reference voltage to determine the data stored within the cell. The cell voltage is an analog value and can vary between a range of values for each value stored within the cell. A margin or window of voltages is configured to separate the cell voltages and mitigate reading incorrect data. This margin or window is referred to as a read window. Additionally, the reference voltage is generally set to be at a midpoint of the read window to further mitigate read errors.

Generally, the read window is maintained to be relatively large. This mitigates reading incorrect data. However, the large read window may also increase power consumption for memory devices, particularly for read operations.

DETAILED DESCRIPTION

Figure 1:
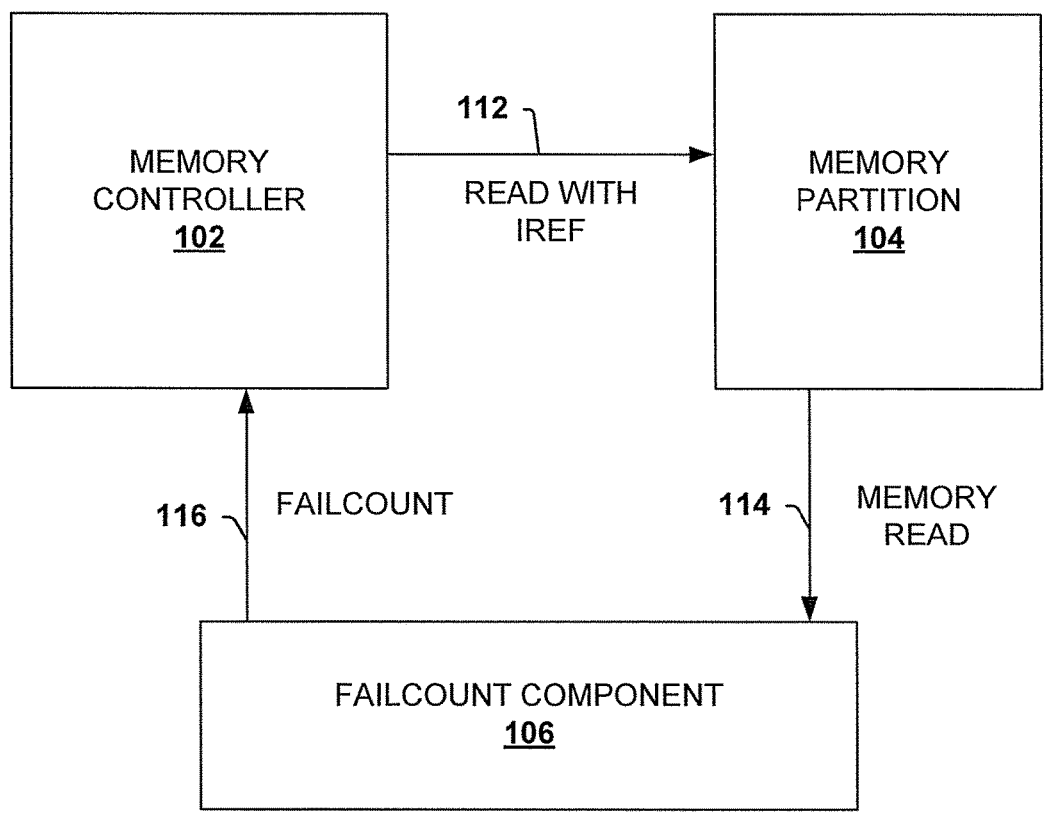
FIG. 1 is a block diagram illustrating a memory system that provides a flexible read reference for dynamic read operations.

The present invention will now be described with reference to the attached drawing figures, wherein like reference numerals are used to refer to like elements throughout, and wherein the illustrated structures and devices are not necessarily drawn to scale.

Systems and methods are disclosed that facilitate non-volatile memory systems by providing a moving reference for a dynamic read window. The moving reference at least partially accounts for threshold voltage shifts that can occur, for example, due to temperature change, cycling, data retention, degradation of cell current, and the like.

FIG. 1 is a block diagram illustrating a memory system 100 that provides a flexible read reference for dynamic read operations. The system 100 is provided in a simplified form in order to facilitate understanding.

The system 100 includes a memory controller 102, a memory partition 104 and a failcount component 106. The memory controller 102 generates a read using a modified reference current 112. The modified reference current 112 corresponds to a modified reference voltage threshold (VTref). The reference current 112 may vary from an initial reference. Further, the reference current 112 can vary over time, as described below, to mitigate read errors.

The memory partition 104 is a partition or subset of at least a portion of a memory device (not shown). The memory partition 104 typically includes memory cells subjected to similar operational characteristics. These include, for example, temperature, humidity, number of cycles, and the like. As a result of being subjected to similar operational characteristics, the cells within the memory partition generally have similar threshold voltages.

In one example, the memory partition 104 includes all the memory cells located on a die. In another example, the memory partition 104 includes all the memory cells located within a common package.

The number of cells present within the memory partition 104 can also vary. In one example, the number of cells within the memory partition is 1024. In another example, the number of cells within the memory partition 104 is 64.

The cells within the memory partition 104 have at least a first state and a second state. However, it is appreciated that the cells can have more than two states, also referred to as multilevel cells. Each state has a threshold value, referred to as a cell state voltage, which is read during read operations using a sense current which generates a read current or a cell state current. The read current, corresponds to the state threshold value, and is compared with the reference current 112 to yield the state or state values. For example, a binary memory cell may yield a value of '0' for state read current above the reference current and a value of '1' for state read current below the reference current 112. The output of the read operation for the cells in the memory partition 104 is provided as a memory read output 114.

The failcount component 106 receives the memory read out 114 and generates a fail indicator or failcount 116. The fail indicator or fail count is a number of failed memory reads for the memory partition. The fail indicator 116 can be generated using a suitable mechanism. In one example, the contents of the memory cells within the partition 104 are known and compared with the read values to determine errors or failed reads, also referred to as the failcount. In another example, checksums, parity bits, cyclic redundancy checks (CRCs), repetition counts, and the like are utilized to indicate the failcount.

In yet another example, error correcting code (ECC) is utilized to indicate the failcount. The ECC code is used along with an ECC algorithm by the failcount component 106 to generate the failcount 116.

The memory controller 102 identifies/calibrates a suitable or optimum reference current/voltage to use for read operations, referred to as $Iref_{opt}/Vref_{opt}$ and/or a read reference. The identification/calibration is referred to as a reference calibration process and suitable examples that can be performed are also included in the methods described below. The $Iref_{opt}$ is stored and used for normal read operations and can be updated/modified later by again performing the calibration process. It is noted that a reference threshold voltage and/or a reference threshold current can be utilized as the read reference for determining cell states. Furthermore, the reference threshold voltage and the reference threshold current can be converted and/or derived from each other.

The reference current calibration process is performed by the memory controller 102 and can be utilized at varied times. For example, the process can be triggered on power up or booting of the system 100, entering or exiting power save modes, powering off, added to other memory operations, and the like. In one example, the process can be triggered during relatively long program/erase operations.

In one example, the reference current calibration includes starting with a previous reference current. This previous reference current can be a default or initial value, be saved or provided from a prior calibration process, and/or the like. The previous reference current is reduced sequentially by a reference amount or steps, also referred to as delta Iref while failcounts are monitored. The modified reference current is provided as the reference current 112 and results in the failcount 116. The number of steps is limited to a step limit, which represents a guardband for a safe read of a low current cell state. The reference current is reduced sequentially until the step limit is reached and/or the failcount exceeds a fail limit. If the failcount is exceeded, it is assumed that the guardband has been passed and the modified reference current is shifted by a value, described below. The last modified reference current is then utilized as the read reference current for read operations. In one example, the fail limit is zero. In another example, the fail limit is greater than zero.

In another example, the reference current calibration described above utilizes a "no fail" reference current as the initial previous reference current. The "no fail" reference current is also referred to as Iref_nofail. In this example, if the initial read using Iref_nofail yields a failcount higher than an acceptable failcount, the previous reference current is sequentially increased by an increase amount until the failcount is less than the acceptable failcount (including a proper guardband). If the initial read using Iref_nofail yields an acceptable failcount, the above calibration process can be followed.

Figure 2:
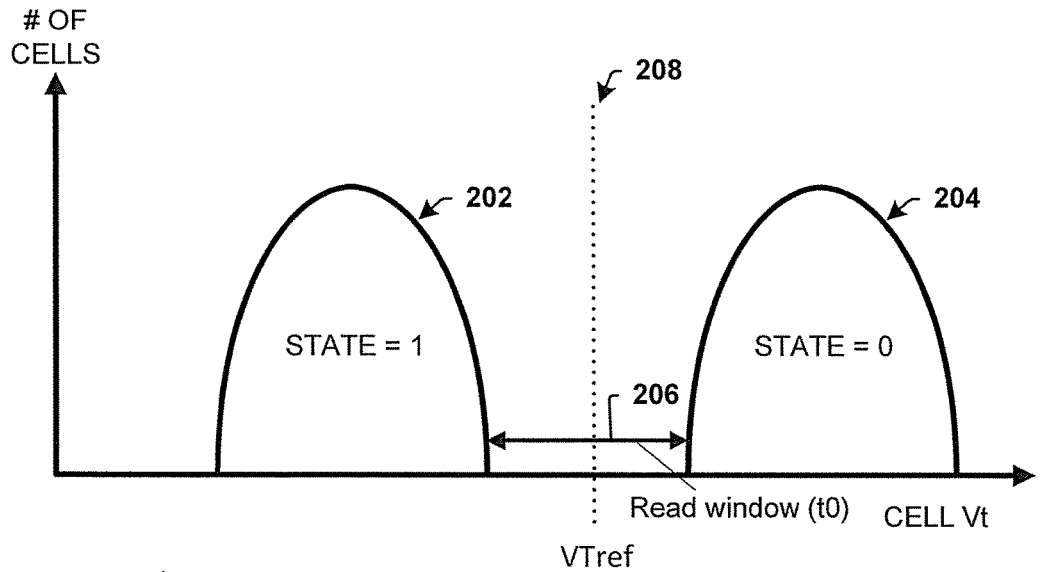
FIG. 2 is a graph illustrating read distributions for a number of non volatile memory cells.

FIG. 2 is a graph 200 illustrating read distributions for a number of non volatile memory cells. The graph 200 is provided as an example to illustrate properties of read operations. The graph 200 is depicted at an initial time, t0, where cycling and other characteristics have not shifted cell voltages/currents.

The graph 200 has an x-axis depicting cell voltage and a y-axis depicting number of cells. The cell voltages correspond to read currents, which can be obtained using a sense current, as described above. The graph 200 includes a first state and a second state for the memory cells. In this example, the first state is '1' and the second state is '0'.

It can be seen that there are two distributions of cell voltages. A first distribution 202 about the first state and a second distribution 204 about the second state. A read window 206 separates the first and second distributions 202 and 204. The read window is centered about a voltage threshold reference 208. In operation, the cell voltages are compared with the reference voltage threshold 208 to determine the state and/or logical value. The comparison can be also done in the current domain where the cell current is compared with a reference current. Here, the cells of the first distribution 202 are properly interpreted as the first state and having a logical value of '1' and cells of the second distribution 204 are interpreted as the second state and having a logical value of '0'.

Figure 3:
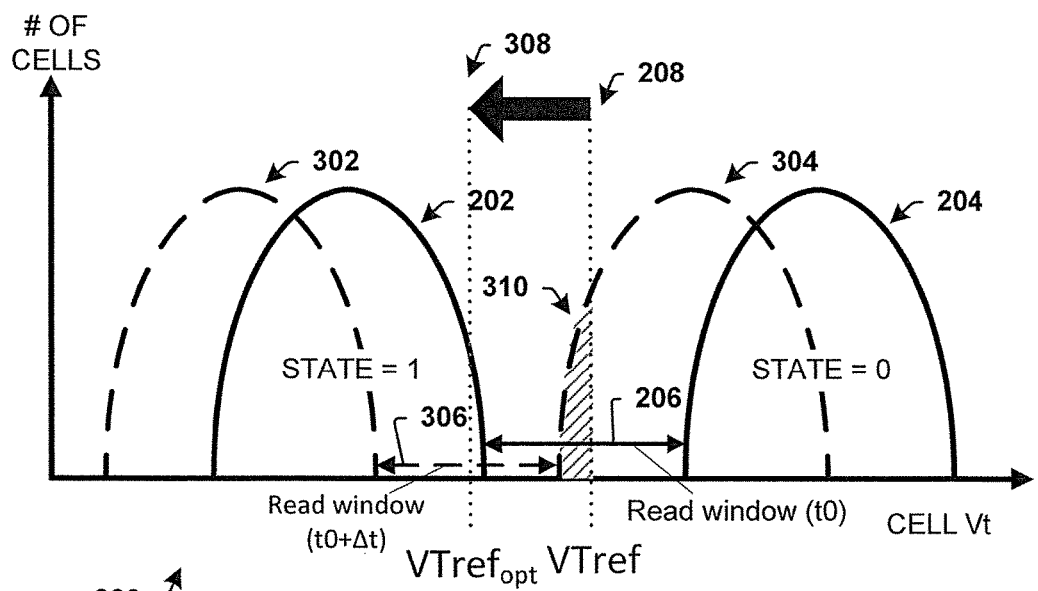
FIG. 3 is a graph illustrating read distributions for a number of non volatile memory cells after a threshold shift.

FIG. 3 is a graph 300 illustrating read distributions for a number of non volatile memory cells after a threshold shift. The graph 300 is provided as an example to illustrate properties of read operations. The graph 300 is depicted at time after than of the graph 200, t0+ delta t, where cycling and other characteristics have shifted cell voltages/currents. The distributions 204, 206 and voltages from t0 are shown for comparison purposes.

The graph 300 has an x-axis depicting cell voltage and a y-axis depicting number of cells. The cell voltages correspond to read currents, which can be obtained using a sense current, as described above. The graph 300 includes a first state and a second state for the memory cells. In this example, the first state is '1' and the second state is '0'.

A first distribution 302 about the first state and a second distribution 304 about the second state. A read window 306 separates the first and second distributions 302 and 304. The read window 306 is not centered about the initial reference voltage threshold 208, but has shifted and is centered about a modified reference voltage threshold 308, also referred to as a read reference.

As described above, the cell voltages are compared with the a reference voltage threshold to determine the state and/or logical value. If the initial reference voltage threshold 208 is used, a portion 310 of the cells of the second distribution 304 are read incorrectly. The failed reads lead to data errors and the like. Further, as the memory cells are subjected to additional operational characteristics, such as use, cycling, and the like, the portion of failed reads will likely become larger.

The system 100, described above, modifies the reference threshold voltage used for detecting states to be the modified reference voltage 308. As a result, the cells of the first distribution 302 are properly interpreted as the first state and having a logical value of '1' and cells of the second distribution 304 are interpreted as the second state and having a logical value of '0'.

It is appreciated that the reference threshold voltage and/or reference threshold current utilized for detecting states in read operations may also be referred to as a read reference or calibrated reference value.

Figure 4:
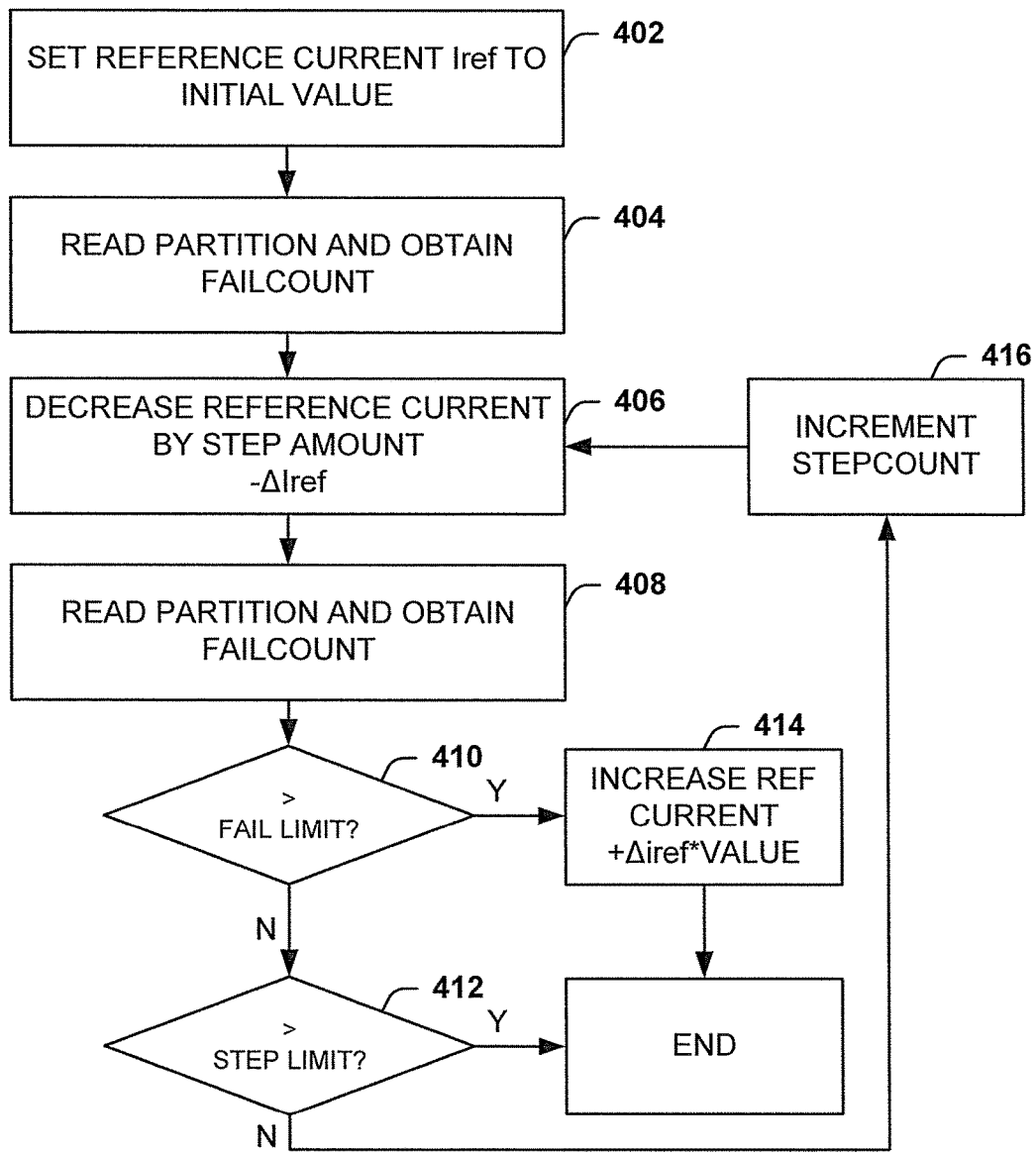
FIG. 4 is a flow diagram illustrating a method of calibrating a read reference current.

FIG. 4 is a flow diagram illustrating a method 400 of calibrating a reference current. The method 400 modifies a reference current while monitoring failcounts and identifies a suitable reference current that can be used for read operation. The suitable reference current corresponds to a suitable reference voltage threshold.

The method begins at block 402, where a present reference current is set to an initial value, other parameters are initialized, and the memory partition is provided. The other parameters are also identified or initialized, including fail limit, reference current change (step) amount ($\Delta$Iref), step limit, stepcount, and the like. Further, the memory cells, referred to as the memory partition, are also selected. The fail limit is a number of failed memory reads for the memory cells of the memory partition. In one example, the fail limit is zero. In another example, the fail limit is 1. The fail limit can depend on error correction techniques used by the memory system the memory partition is in. Thus, for example, if the system can correct 1 bit per 64 bit word, the fail limit can be set to 1 and still maintain data integrity.

The step amount is the amount of current change that will occur for each iteration. A smaller reference current change may permit a more accurate modified reference current to be identified. The step limit is the number of possible iterations that can be performed. The step limit can be selected to mitigate moving the modified reference current into a distribution of a lower voltage state, such as the distribution 202 of the first state of FIG. 2.

The memory partition is a partition of at least a portion of a memory device. The partition includes cells subjected to similar operation characteristic and, consequently, similar reference shifts, such as shown in FIG. 3. The operation characteristics include, for example, temperature, humidity, number of Program/Erase cycles, and the like.

A read operation is performed on the memory partition using the initial reference current at block 404. A failcount is obtained as a result. The failcount is obtained by identifying a number of failed bit reads or failed reads. The read operation uses a sense current to measure a state or read current of each memory cell in the partition. The measured state current is compared with the initial reference current to determine its state. If the determined state is incorrect, the read for that cell is deemed incorrect and the failcount is incremented by 1. If the failcount exceeds a threshold value, the method may return to block 402 and use a higher initial reference current.

The reference current is decreased by the step amount (ΔIref) at block 406 to yield a new present or a modified reference current. Subsequently, the memory partition is read and a failcount is obtained at block 408. The failcount corresponds to the modified reference current.

The failcount is compared with the fail limit at block 410. If the failcount exceeds the fail limit, the method moves to block 414. As described above, the fail limit sets an acceptable failure value. If the failcount exceeds the faillimit, the modified reference current is likely too close or within one of the state distributions, such as shown in FIG. 3. Otherwise, the method moves to block 412.

At block 412, the stepcount or number of iterations is compared with the step limit. As described above, the step limit is the number of possible iterations that can be performed. If the step limit is exceeded, the method 400 ends and the modified reference current is provided as the suitable reference current. Otherwise, the method 400 moves to block 416.

The stepcount is incremented at block 416. Thus, the stepcount represents the number of iterations performed. The method 400 continues on at step 406.

At block 414, the memory partition has been read and the fail count exceeds the selected fail limit. The reference current has been reduced beyond a guardband and is increased by the step amount multiplied by a value in order to move a sufficient distance from the guardband. The value is based on the step limit and the stepcount. In one example, the value is the step limit minus the stepcount. The modified reference current after the increase is provided as the suitable reference current. As an example, the first iteration is a stepcount of 0 and the step limit is 3, thus the value would be 3. In another example, the third iteration has a stepcount of 2 and the step limit is 3, thus the value would be 1.

The method 400 can be repeated using the suitable reference current as the initial value. Further, the method 400 can be triggered on boot, entering or exiting power saving modes, powering off, relatively long read operations, and the like.

Figure 5:
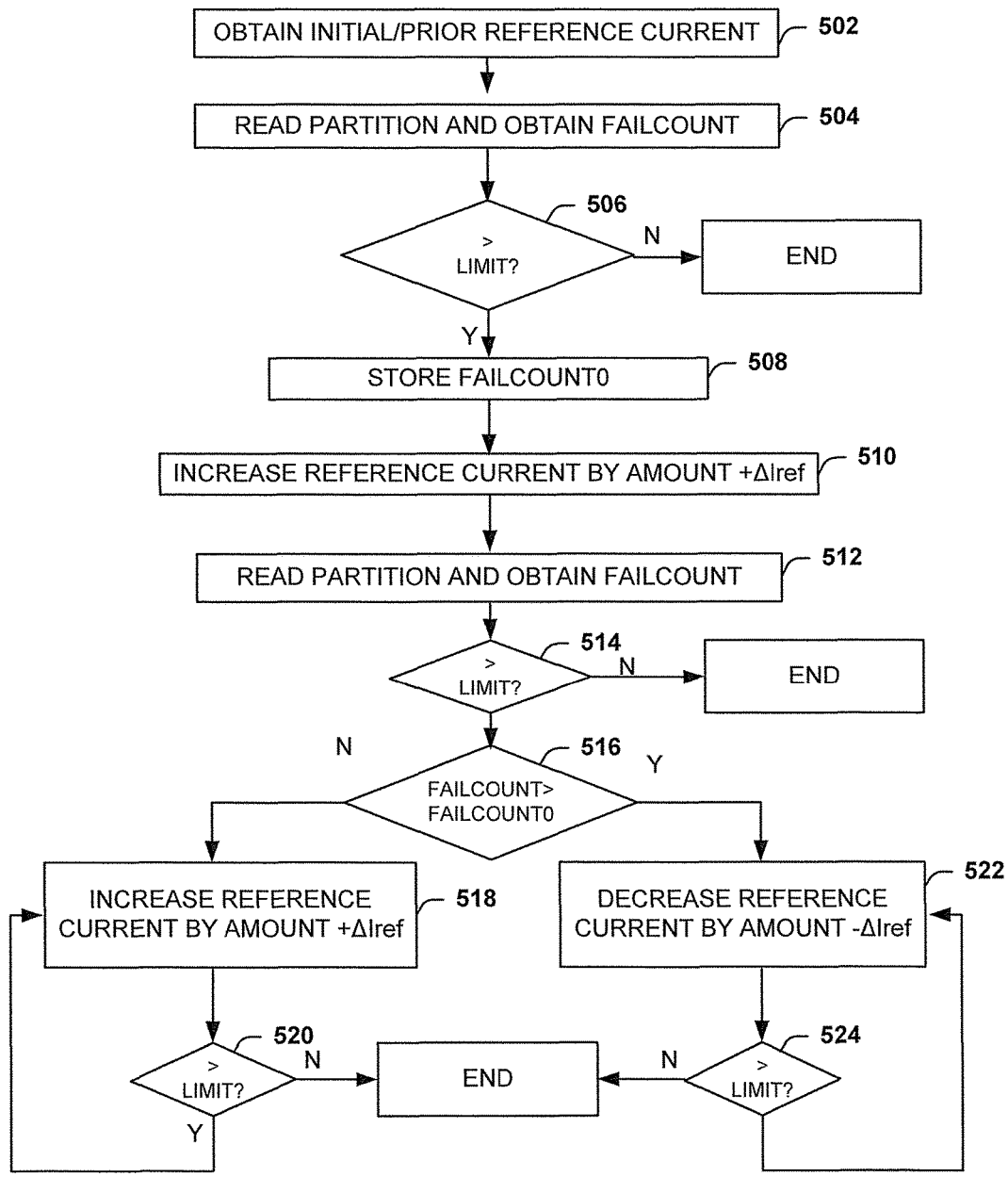
FIG. 5 is a flow diagram illustrating a method of calibrating a read reference current.

FIG. 5 is a block diagram illustrating a method 500 of calibrating a read reference current including a calibration direction. The method 500 checks an initial failcount with a limit and identifies a direction for calibration or modifying the read reference current. The method 500 can be utilized in conjunction with the method 400 and the system 100.

Over time, the cell voltages and resulting currents for read operations can shift due to the operation characteristics. Typically, the shift after time and higher temperature is to lower voltages as shown in FIG. 3. For example, a memory device not used for several days may shift back to default values. However, after an Erase/Program operation the cells can shift back towards original or even higher values and thereby shift away from calibrated suitable reference currents. The method 500 identifies and accounts for these types of shifts.

The method begins at block 502, wherein an initial reference current is obtained. This initial reference current can be obtained from a prior calibration process or another suitable mechanism. Additionally, a memory partition, which includes a number of memory cells, is identified.

The partition is read and a failcount is obtained at block 504. The failcount is obtained as described above.

The failcount is compared with an initial fail limit at block 506. In one example, the initial fail limit is zero, meaning that all the memory cells were read without error. If the failcount is less than or equal the initial fail limit, the method 500 ends. On the failcount exceeding the initial fail limit, the method moves to block 508, where the initial failcount obtained at block 504 is stored as FAILCOUNT0. The FAILCOUNT0 represents the first or initial failcount measured using the initial reference current.

It is appreciated that if the initial failcount is greater than an acceptable value, the method 500 can return to block 502 or 504 and utilize a different value for the initial reference current. For example, the initial reference current can be set to a "no fail" value, where it is expected that no read failures will occur. An example of a different value includes a reference current corresponding to the reference voltage 208 of FIG. 2 or FIG. 3. The method 500 would then continue.

The initial reference current is increased by a step amount at block 510. The increased reference current is referred to as a modified reference current. The amount of the increase can be similar to the step amount used in the method 400.

The partition is again read at block 512 and a current failcount is obtained. The current failcount corresponds to the modified reference current. The current failcount is compared with the fail limit at block 514. If the current failcount from block 512 is less than or equal to the fail limit, the method 500 ends. Otherwise, the method 500 continues to block 516.

At block 516, the failcount is compared with the initial failcount (FAILCOUNT0) from block 508. The comparison indicates a direction for modifying the reference current. If the failcount is greater than the initial failcount, the increase in the reference current increased the read errors and the failcount and it is likely that further increases would increase read errors. Thus, the modified reference current should be decreased or shifted left, referring to FIGS. 2 and 3. If the failcount is less than or equal to the initial failcount, it is likely that the reference current should be increased or shifted to the right. Thus, If the failcount is less than or equal to the initial failcount, the method 500 goes to block 518. Otherwise, if the failcount is greater than the initial failcount, the method 500 moves to block 522.

At block 518, the modified reference current is increased by the step amount, the partition is read and the failcount is obtained. In one example, the step amount used at block 518 is varied from the step amount used at block 510. The failcount corresponds to the modified reference current after being increased. The failcount is compared with the fail limit at block 520. If the failcount is less than or equal to the fail limit, the method 500 ends. Otherwise, the method 500 moves to block 518. The loop of blocks 518 and 520 can repeat any number of times until the failcount is less than or equal to the fail limit.

At block 522, the modified reference current is decreased by the step amount, the partition is read and the failcount is obtained. The failcount is based on the modified reference current after being decreased at block 522. In one example the step amount is varied from the step amount used at blocks 518 and/or 510. The failcount of block 522 is compared with the fail limit at block 524. On the fail count being less than or equal to the fail limit, the method 500 ends as shown. Otherwise, the method 500 moves again to block 522. The decreasing current loop of blocks 522 and 524 can be repeated any number of times until the failcount is less than or equal to the fail limit.

It is appreciated that variations in the method 500 are contemplated. For example, blocks can be omitted, performed in varied orders, and additional items not included can be performed.

Figure 6:
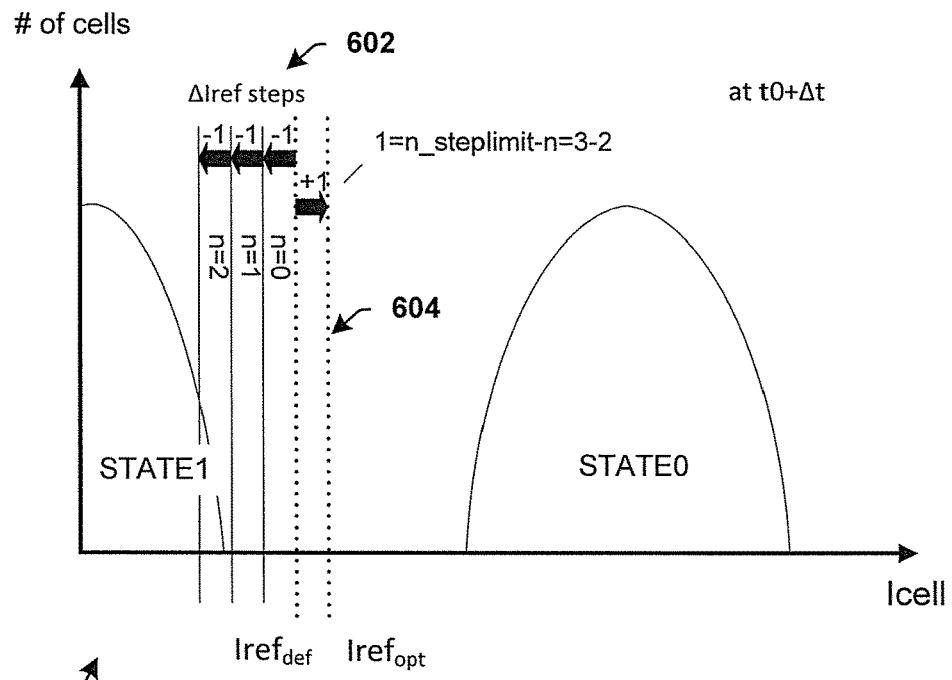
FIG. 6 is a graph depicting an example wherein a fail limit is exceeded using the above method.

FIG. 6 is a graph 600 depicting an example wherein a fail limit is exceeded using the above method 400. The graph 600 is provided to illustrate an example utilization of the method 400 and is not intended to limit the method 400.

The graph 600 depicts sensed read currents on an x-axis and number of cells on a y-axis. The graph further depicts a first distribution corresponding to STATE1 and a second distribution corresponding to STATE0. A fail limit is set at 0 and the step limit is set at 3.

Here, the method 400 is used starting with the modified reference current at an initial value shown as $Iref_{def}$. The modified reference current is sequentially decreased as shown by 602 until the step count (n) is equal to 2. This is less than the step limit of 3, however the failcount at this point exceeds a fail limit, set to zero. Thus, a guardband has been reached as shown by the n=2 line entering into a distribution for STATE1. Thus, failed reads occur for a number of the cells causing the failcount to exceed the fail limit.

The modified reference current is adjusted to the value shown at Irefopt at 604. The $Iref_{opt}$ is increased by delta Iref*1, where 1 is obtained by subtracting the last step count (2) from the step limit (3).

Figure 7:
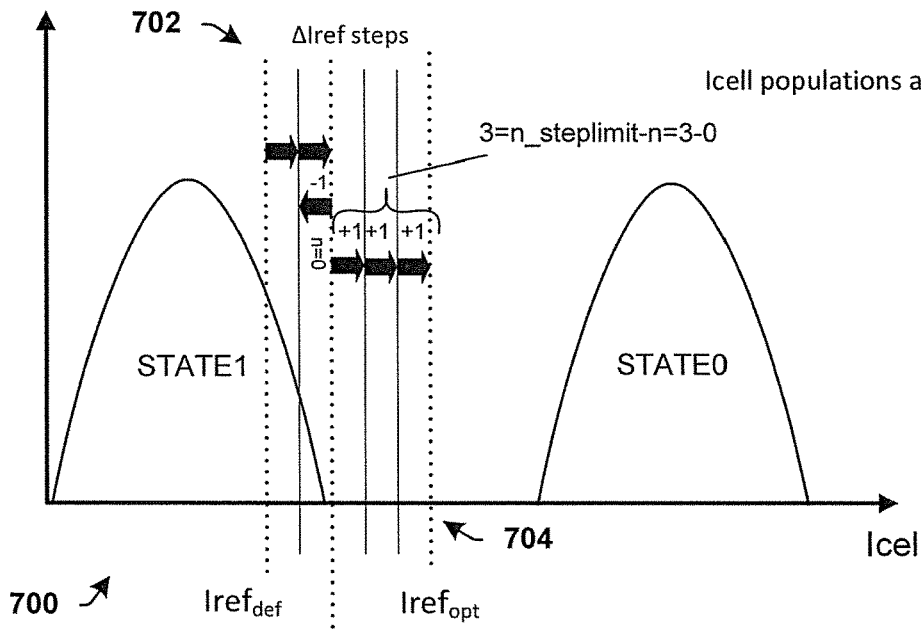
FIG. 7 is a graph depicting an example of developing an initial modified reference current has a failcount that exceeds a threshold value.

FIG. 7 is a graph 700 depicting an example of developing an initial modified reference current has a failcount that exceeds a threshold value. The graph 700 can be obtained using the method 500 and/or variations thereof. However, it is noted that the graph 700 is provided to illustrate an example utilization of the above methods, not to limit them.

The graph 700 depicts sensed read currents on an x-axis and number of cells on a y-axis. The graph 700 further depicts a first distribution corresponding to STATE1 and a second distribution corresponding to STATE0. A fail limit is set at 0 and the step limit is set at 3.

Here, it can be seen that an initial reference value, $Iref_{def}$, is within the distribution for the STATE1. As a result, its associated failcount exceeds an acceptable threshold. Thus, the modified reference current is shifted to the Irefnofail followed by 3 effective shifts to the right.

It is appreciated that the above methods and variations thereof can be combined and utilized interchangeably.

While the above methods are is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

It is appreciated that the claimed subject matter may be implemented as a method, apparatus, or article of manufacture using standard programming and/or engineering techniques to produce software, firmware, hardware, or any combination thereof to control a computer to implement the disclosed subject matter (e.g., the systems shown above, are non-limiting examples of system that may be used to implement methods). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

A memory system having a flexible read reference is disclosed. The system includes a memory partition, a failcount component, and a controller. The memory partition includes a plurality of memory cells. The failcount component is configured to generate failcounts in response to read operations of the memory partition. The controller is configured to calibrate a reference value for the memory partition by utilizing the failcounts.

A method of calibrating a read reference for a memory system is disclosed. A reference value is set to an initial value. The reference value is sequentially decreased by a step amount until a limit is exceeded. The reference value is provided as a calibrated reference value.

Another method of calibrating a read reference for a memory system is disclosed. A memory partition of a device is selected. The selected memory partition has or is selected to have similar cell state voltages. A reference value is set to an initial value. The memory partition is read using the initial value and an initial failcount is obtained. The reference value is increased by a step amount. The memory partition is again read using the increased reference value to obtain a modified failcount. On the modified failcount exceeding the initial failcount, the reference value is iteratively decreased by the step amount until a decreased reference failcount is lower than or equal to the fail limit. On the modified failcount being less than or equal to the initial failcount, the reference value is iteratively increased by the step amount until an increased reference failcount is lower than or equal to the fail limit.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A memory system utilizing a flexible read reference, the system comprising:

a memory partition having a plurality of memory cells, wherein each cell has a cell state voltage based on a read operation;

a failcount component configured to generate failcounts in response to read operations of the memory partition, where the failcounts indicate a number of the memory cells having failed reads; and a controller configured to generate a calibrated reference value for read operations of the memory partition by utilizing the failcounts from the failcount component, wherein the controller is configured to generate the calibrated reference value by sequentially reducing a modified reference value until the failcount exceeds a fail limit to obtain the calibrated reference value, wherein the modified reference value starts at an initial value, wherein the calibrated reference value is compared with a cell state voltage to determine a cell state.

2. The system of claim 1, where the plurality of memory cells in the memory partition have been subjected to operational characteristics.

3. The system of claim 2, wherein the operational characteristics include a number of program/erase cycles.

4. The system of claim 1, wherein the reference value is a reference current.

5. The system of claim 1, wherein the reference value is a reference voltage.

6. The system of claim 1, wherein the failcount component utilizes one or more of checksums, parity bits, cyclic redundancy checks, and error correcting code to generate the failcounts.

7. The system of claim 1, wherein the failcount component compares known contents with read values to generate the failcounts.

8. The system of claim 1, wherein the controller is configured to perform the read operations with the modified reference value.

9. The system of claim 8, wherein the controller is configured to decrease the modified reference value by a step amount until the fail limit or a step limit is reached.

10. The system of claim 9, wherein the step limit is reached on the modified reference value being decreased to a guardband associated with a current state.

11. The system of claim 9, wherein the fail limit is zero.

12. The system of claim 1, wherein the controller is configured to calibrate the reference value on boot or after a program or an erase operation.

13. A method of calibrating a memory system, the method comprising:
  setting a reference value to an initial value;
  sequentially decreasing the reference value by a step amount until a limit is exceeded, wherein the limit includes a step limit and a fail limit;
  providing the reference value as a calibrated reference value; and
  performing one or more read operations to determine a cell state by comparing a read cell state voltage with the calibrated reference value.

14. The method of claim 13, wherein sequentially decreasing the reference value includes reducing the reference value by the step amount and reading the memory partition to obtain a failcount.

15. The method of claim 14, wherein sequentially decreasing the reference value includes comparing the failcount to the limit.

16. The method of claim 13, wherein the memory system includes a number of memory cells subjected to a threshold shift and wherein the provided calibrated reference value corresponds to the threshold shift.

17. The method of claim 13, further comprising generating an initial failcount based on the initial value and increasing the reference value on the initial failcount exceeding an acceptable threshold.

* * * * *